United States Patent
Zhang

(10) Patent No.: US 9,880,465 B2
(45) Date of Patent: Jan. 30, 2018

(54) PHOTORESIST COMPOSITION AND COLOR FILTER MANUFACTURING METHOD

(71) Applicant: Shenzhen China Star Optoelectronics Technology Co., Ltd., Shenzhen (CN)

(72) Inventor: Yueyan Zhang, Shenzhen (CN)

(73) Assignee: SHENZHEN CHINA STAR OPTOELECTRONICS TECHNOLOGY CO., LTD., Shenzhen, Guangdong (CN)

( * ) Notice: Subject to any disclaimer, the term of this patent is extended or adjusted under 35 U.S.C. 154(b) by 193 days.

(21) Appl. No.: 14/902,586

(22) PCT Filed: Dec. 25, 2015

(86) PCT No.: PCT/CN2015/098863
§ 371 (c)(1),
(2) Date: Jan. 3, 2016

(87) PCT Pub. No.: WO2017/096647
PCT Pub. Date: Jun. 15, 2017

(65) Prior Publication Data
US 2017/0227845 A1    Aug. 10, 2017

(30) Foreign Application Priority Data

Dec. 8, 2015  (CN) .......................... 2015 1 0896311

(51) Int. Cl.
| | | |
|---|---|---|
| G03F 7/028 | (2006.01) | |
| G02B 5/20 | (2006.01) | |
| G03F 7/00 | (2006.01) | |
| G03F 7/038 | (2006.01) | |
| G03F 7/039 | (2006.01) | |
| G03F 7/20 | (2006.01) | |

(Continued)

(52) U.S. Cl.
CPC ........... *G03F 7/0007* (2013.01); *G02B 5/223* (2013.01); *G02F 1/133516* (2013.01); *G03F 7/0048* (2013.01); *G03F 7/038* (2013.01); *G03F 7/039* (2013.01); *G03F 7/168* (2013.01); *G03F 7/2004* (2013.01); *G03F 7/36* (2013.01); *G03F 7/40* (2013.01)

(58) Field of Classification Search
CPC ...... G03F 7/0007; G03F 7/0048; G03F 7/028; G03F 7/004; G03F 7/168; G02B 5/223; G02F 1/133516
USPC ....................... 430/7, 270.1, 281.1
See application file for complete search history.

(56) References Cited

U.S. PATENT DOCUMENTS

2008/0070153 A1* 3/2008 Ioku .................. C09K 11/62
430/270.1

* cited by examiner

*Primary Examiner* — John A McPherson
(74) *Attorney, Agent, or Firm* — Leong C. Lei

(57) ABSTRACT

The present invention provides a photoresist composition and a color filter manufacturing method. The photoresist composition of the present invention includes a first solvent, a second solvent, a photo initiator, a monomer, a polymer, an additive, and a pigment. After heating, phase separation occurs between the first solvent and the second solvent. After the phase separation, the first solvent is located above the second solvent. At least one of the photo initiator, the monomer, the polymer, and the additive has solubility in the second solvent that is higher than that in the first solvent so as to alleviate the wrinkling issue caused by different degrees of solidification between upper and lower layers of the photoresist during a manufacturing process of a color filter.

10 Claims, 3 Drawing Sheets

(51) Int. Cl.
*G03F 7/004* (2006.01)
*G03F 7/16* (2006.01)
*G03F 7/36* (2006.01)
*G03F 7/40* (2006.01)
*G02F 1/1335* (2006.01)
*G02B 5/22* (2006.01)

PHOTORESIST COMPOSITION AND COLOR FILTER MANUFACTURING METHOD

BACKGROUND OF THE INVENTION

1. Field of the Invention

The present invention relates to the field of manufacture of display panels, and in particular to a photoresist composition and a color filter manufacturing method.

2. The Related Arts

Thin-film transistor liquid crystal displays (TFT LCDs) have various advantages, such as high colorfulness, small size, and low power consumption, and take a leading position in the field of flat panel displays. As one of the important components of a liquid crystal display, a color filter generally realizes color displaying by filtering light with a RGB color layer. The conventional way of manufacturing a color filter generally includes operations of film coating, pre-baking, exposure, development, high-temperature post-baking. The basic principle is to coat a photoresist composition on a transparent backing plate, following by irradiation of light from for example an ultraviolet lamp to cause solidification of the photoresist composition for formation of a color film layer. The photoresist composition generally includes pigments, monomers, polymers, photo-initiators, additives, and a solvent, among which the photo-initiators are activated by light irradiation so as to cause a crosslinking polymerization reaction of the monomers, making the photoresist composition solidified to form the color film layer.

In a manufacturing process of a color filter, as shown in FIG. 1, a photoresist film 100 formed through coating would have a thickness. During exposure, light must travels through a surface of the photoresist film to reach the bottom. This makes the light that reaches the bottom less than that arrives at the surface layer, so that the photo initiator 110 located at the bottom of the photoresist film would have a reduced rate of being activated, making the solidification rate of the bottom relatively low. Due the difference of solidification rate between the surface and the bottom, the surface of the film would readily get shrunk during high-temperature post-baking, leading to wrinkling on the surface. The formation of the wrinkling would affect the production of the color filter and impose great influence on the subsequent process.

Thus, to handle the above-discussed problem, it is desired to provide a novel photoresist composition and a color filter manufacturing method.

SUMMARY OF THE INVENTION

An object of the present invention is to provide a photoresist composition, which, when heated, causes phase separation to form upper and lower layers having different ingredient concentration so as to alleviate a wrinkling issue caused by different degrees of solidification between the upper and lower layers of the photoresist during a manufacturing process of a color filter.

Another object of the present invention is to provide a color filter manufacturing method, which uses a photoresist composition that causes phase separation during a pre-baking operation so as to form separate upper and lower layers having different ingredient concentrations and thus alleviating a wrinkling issue caused by different degrees of solidification between the upper and lower layers of the photoresist during a manufacturing process of a color filter.

To achieve the above objects, the present invention provides a photoresist composition, which comprises a first solvent, a second solvent, a photo initiator, a monomer, a polymer, an additive, and a pigment;

wherein after the photoresist composition is heated, phase separation occurs between the first solvent and the second solvent so that after the phase separation, the first solvent is located above the second solvent, at least one of the photo initiator, the monomer, the polymer, and the additive having solubility in the second solvent higher than that in the first solvent.

The first solvent comprises one or multiple solvent substances.

The second solvent comprises one or multiple solvent substances.

The photo initiator has solubility in the second solvent that is higher than that in the first solvent.

The photoresist composition is applicable in manufacturing a color filter.

The present invention also provides a color filter manufacturing method, which comprises the following steps:

(1) providing a photoresist composition, which comprises a first solvent, a second solvent, a photo initiator, a monomer, a polymer, an additive, and a pigment, wherein the photoresist composition is coated on a backing plate in such a way that ingredients of the photoresist composition are uniformly mixed;

(2) subjecting the photoresist composition to a pre-baking operation, wherein during the pre-baking operation, phase separation occurs between the first solvent and the second solvent of the photoresist composition and after the phase separation, the first solvent is located at an upper layer, while the second solvent is located at a lower layer, wherein at least one of the photo initiator, the monomer, the polymer, and the additive has solubility in the second solvent higher than that in the first solvent;

(3) subjecting the photoresist composition that has been subjected to phase separation to exposure, wherein under irradiation, the photo initiator contained in the photoresist composition causes a polymerization reaction of the monomer to thereby get solidified, wherein at least one of the photo initiator, the monomer, the polymer, and the additive has a concentration in the lower layer that is greater than that in the upper layer so that the upper and lower layers have substantially identical degrees of solidification; and (4) subjecting the photoresist composition that has been subjected to exposure to development and high-temperature post-baking operations to obtain a color filter.

In the photoresist composition, the first solvent comprises one or multiple solvent substances.

In the photoresist composition, the second solvent comprises one or multiple solvent substances.

The photo initiator has solubility in the second solvent that is higher than that in the first solvent.

In step (3), the exposure is conducted by irradiating the photoresist composition with ultraviolet light.

The present invention further provides photoresist composition, which comprises a first solvent, a second solvent, a photo initiator, a monomer, a polymer, an additive, and a pigment;

wherein after the photoresist composition is heated, phase separation occurs between the first solvent and the second solvent so that after the phase separation, the first solvent is located above the second solvent, at least one of the photo initiator, the monomer, the polymer, and the additive having solubility in the second solvent higher than that in the first solvent;

wherein the first solvent comprises one or multiple solvent substances;

wherein the second solvent comprises one or multiple solvent substances; and wherein the photo initiator has solubility in the second solvent that is higher than that in the first solvent.

The efficacy of the present invention is that the present invention provides a photoresist composition, which comprises a first solvent, a second solvent, a photo initiator, a monomer, a polymer, an additive, and a pigment so that after heating, phase separation occurs between the first solvent and the second solvent and after the phase separation, the first solvent is located above the second solvent. At least one of the photo initiator, the monomer, the polymer, and the additive has solubility in the second solvent that is higher than that in the first solvent so as to alleviate the wrinkling issue caused by different degrees of solidification between upper and lower layers of the photoresist during a manufacturing process of a color filter. The present invention provides a color filter manufacturing method, which uses a photoresist composition that causes phase separation during a pre-baking operation so as to form separate upper and lower layers having different ingredient concentrations, allowing the photoresist composition to gain substantially identical degrees of solidification for the upper and lower layers during an exposure process thereby overcoming the wrinkling issue occurring in the manufacturing process of the color filter.

For better understanding of the features and technical contents of the present invention, reference will be made to the following detailed description of the present invention and the attached drawings. However, the drawings are provided for the purposes of reference and illustration and are not intended to impose limitations to the present invention.

BRIEF DESCRIPTION OF THE DRAWINGS

The technical solution, as well as other beneficial advantages, of the present invention will become apparent from the following detailed description of an embodiment of the present invention, with reference to the attached drawings.

In the drawings.

DETAILED DESCRIPTION OF THE PREFERRED EMBODIMENTS

To further expound the technical solution adopted in the present invention and the advantages thereof, a detailed description is given to a preferred embodiment of the present invention and the attached drawings.

Figure 1:
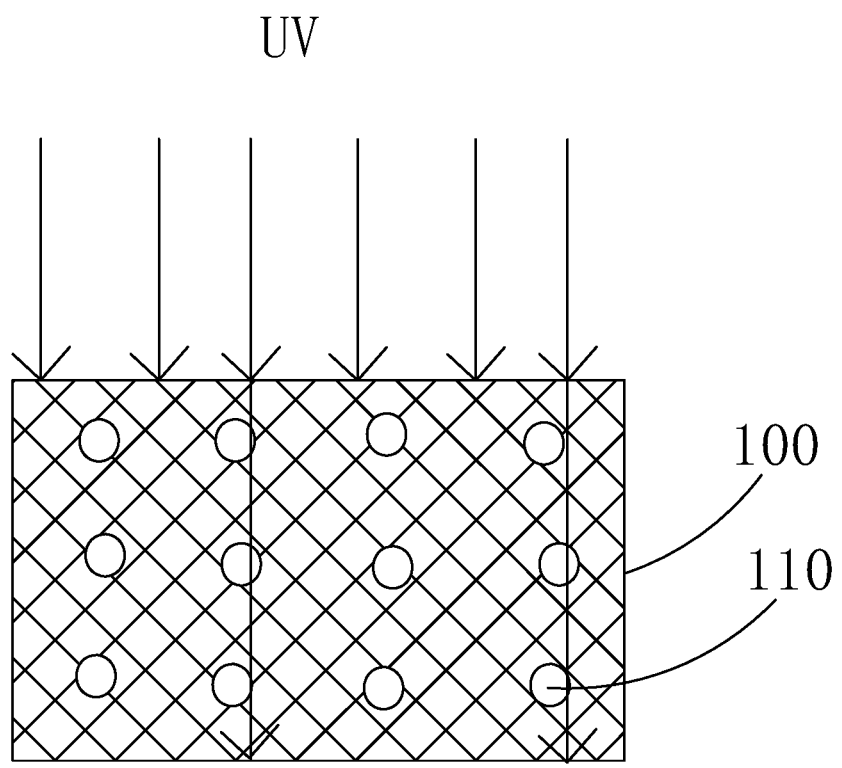
FIG. 1 is a schematic view illustrating different degrees of solidification at a surface and a bottom of a photoresist film resulting from reception of different amounts of light irradiation.
Figure 2:
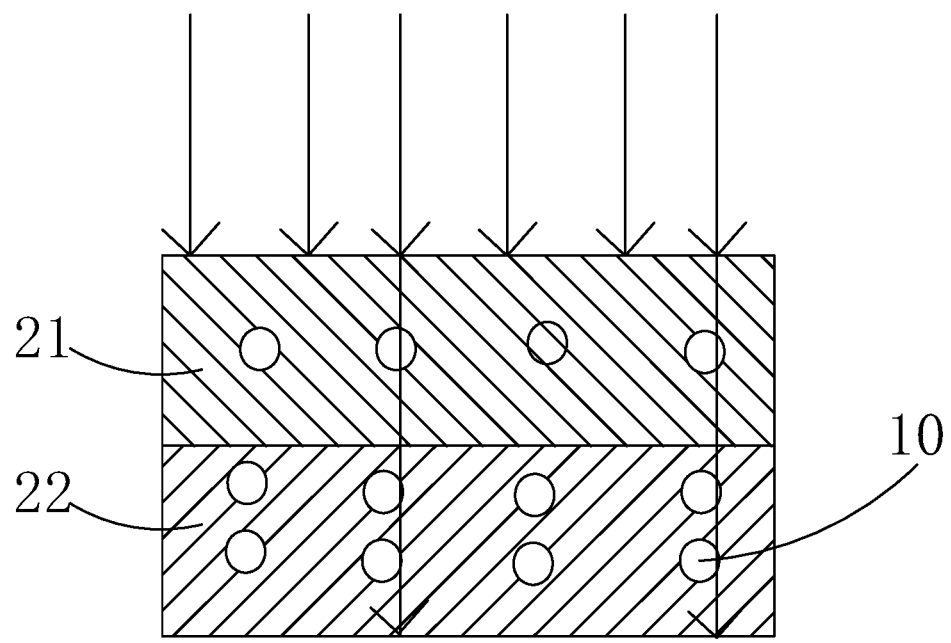
FIG. 2 is a schematic view illustrating separation of solvents of the photoresist composition according to the present invention into various layers after being heated.

Referring to FIG. 2, firstly, the present invention provides a photoresist composition, which comprises a first solvent 21, a second solvent 22, a photo initiator 10, a monomer, a polymer, an additive, and a pigment.

After the photoresist composition is heated, phase separation occurs between the first solvent 21 and the second solvent 22 so that after the phase separation, the first solvent 21 is located above the second solvent 22. At least one of the photo initiator 10, the monomer, the polymer, and the additive has solubility in the second solvent 22 higher than that in the first solvent 21.

Specifically, the first solvent 21 is composed of one or multiple solvent substances and the second solvent 22 is composed of one or multiple solvent substances.

Preferably, the solubility of the photo initiator 10 in the second solvent 22 is higher than that in the first solvent 21.

The photoresist composition of the present invention is applicable to the manufacture of a color filter. During a pre-baking operation of the photoresist composition, the first and second solvents 21, 22 get separated into different layers with increase of temperature, variation of pressure, worsening of compatibility so as to induce the phase separation, wherein the first solvent 21 is located at an upper layer, while the second solvent 22 at a lower layer. At least one of the photo initiator 10, the monomer, the polymer, and the additive, such as the photo initiator 10, has solubility in the second solvent 22 higher than that in the first solvent 21 so that in an exposure operation, although the amount of light reaching the bottom of the photoresist composition is less than that at the surface, since the amount of the photo initiator 10 in the second solvent 22 located in the lower layer is relatively large, the reaction rates in the upper and lower layers of the photoresist composition is made balanced to achieve identical degrees of solidification of the upper and lower layers of the photoresist composition, thereby preventing the occurrence of wrinkling. Similarly, the solubility of the monomer or the additive in the second solvent 22 being higher than that in the first solvent 21 can be used to handle the problems of product abnormality resulting from inhomogeneous reaction in the photoresist layer.

Figure 3:
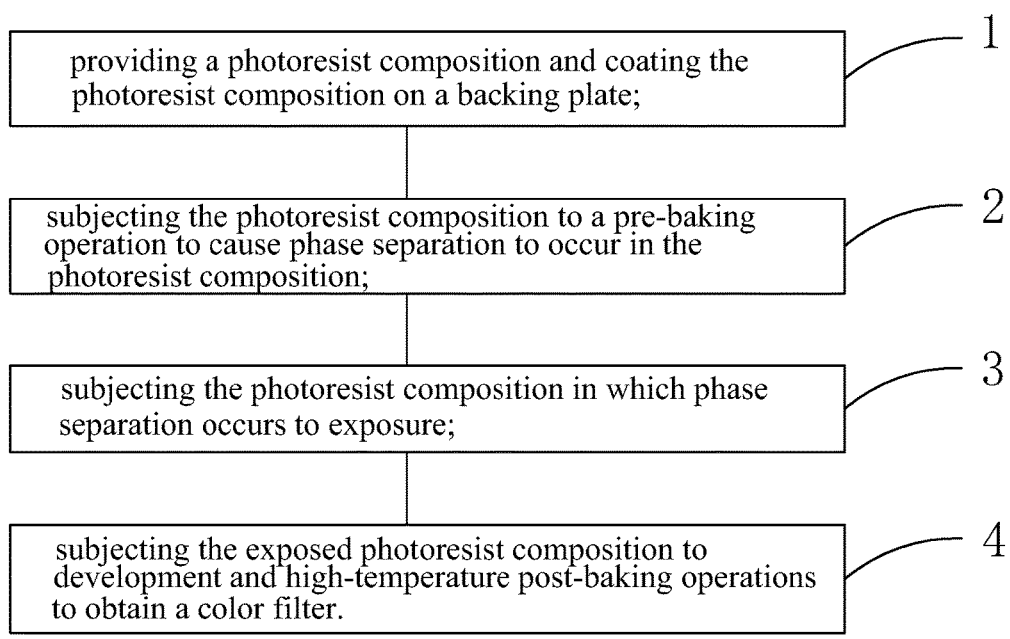
FIG. 3 is a flow chart illustrating a color filter manufacturing method according to the present invention.

Referring to FIG. 3, the present invention also provides a color filter manufacturing method, which comprises the following steps:

Step 1: providing a photoresist composition, which comprises a first solvent 21, a second solvent 22, a photo initiator 10, a monomer, a polymer, an additive, and a pigment;

wherein the photoresist composition is coated on a backing plate in such a way that ingredients of the photoresist composition are uniformly mixed.

Specifically, in the photoresist composition, the first solvent 21 is composed of one or multiple solvent substances and the second solvent 22 is composed of one or multiple solvent substances.

Step 2: subjecting the photoresist composition to a pre-baking operation, wherein during the pre-baking operation, phase separation occurs between the first solvent 21 and the second solvent 22 of the photoresist composition and after the phase separation, the first solvent 21 is located at an upper layer, while the second solvent 22 is located at a lower layer, wherein at least one of the photo initiator 10, the monomer, the polymer, and the additive has solubility in the second solvent 22 higher than that in the first solvent 21.

Specifically, in Step 2, before the pre-baking operation of the photoresist composition, the photoresist composition may be subjected to vacuum dry (VCD) treatment so as to remove a majority of the solvent from photoresist composition before the pre-baking operation thereby increasing the film formation rate of the photoresist composition.

Preferably, the solubility of the photo initiator 10 in the second solvent 22 is higher than that in the first solvent 21.

Step 3: irradiating the photoresist composition that has been subjected to phase separation with ultraviolet light for exposure, wherein under the irradiation, the photo initiator 10 contained in the photoresist composition causes a polymerization reaction of the monomer to thereby get solidified, wherein at least one of the photo initiator 10, the monomer, the polymer, and the additive has a concentration in the lower layer that is greater than that in the upper layer so that the upper and lower layers have substantially identical degrees of solidification.

As shown in FIG. 3, in this step, although the amount of the ultraviolet light reaching the bottom of the photoresist composition is less than that at the surface, since the amount of the photo initiator 10 in the second solvent 22 located in the lower layer is relatively large, the reaction rates in the upper and lower layers of the photoresist composition is made balanced to achieve identical degrees of solidification of the upper and lower layers of the photoresist composition, thereby preventing the occurrence of wrinkling. Similarly, the solubility of the monomer, polymer, or the additive in the second solvent 22 being higher than that in the first solvent 21 can be used to handle the problems of product abnormality resulting from inhomogeneous reaction in the photoresist layer.

Step 4: subjecting the photoresist composition that has been subjected to exposure to development and high-temperature post-baking operations to obtain a color filter.

In summary, the present invention provides a photoresist composition, which comprises a first solvent, a second solvent, a photo initiator, a monomer, a polymer, an additive, and a pigment so that after heating, phase separation occurs between the first solvent and the second solvent and after the phase separation, the first solvent is located above the second solvent. At least one of the photo initiator, the monomer, the polymer, and the additive has solubility in the second solvent that is higher than that in the first solvent so as to alleviate the wrinkling issue caused by different degrees of solidification between upper and lower layers of the photoresist during a manufacturing process of a color filter. The present invention provides a color filter manufacturing method, which uses a photoresist composition that causes phase separation during a pre-baking operation so as to form separate upper and lower layers having different ingredient concentrations, allowing the photoresist composition to gain substantially identical degrees of solidification for the upper and lower layers during an exposure process thereby overcoming the wrinkling issue occurring in the manufacturing process of the color filter.

Based on the description given above, those having ordinary skills of the art may easily contemplate various changes and modifications of the technical solution and technical ideas of the present invention and all these changes and modifications are considered within the protection scope of right for the present invention.

What is claimed is:

1. A photoresist composition, comprising a first solvent, a second solvent, a photo initiator, a monomer, a polymer, an additive, and a pigment;
   wherein after the photoresist composition is heated, phase separation occurs between the first solvent and the second solvent so that after the phase separation, the first solvent is located above the second solvent, at least one of the photo initiator, the monomer, the polymer, and the additive having solubility in the second solvent higher than that in the first solvent; and
   wherein the photo initiator has solubility in the second solvent that is higher than that in the first solvent.

2. The photoresist composition as claimed in claim 1, wherein the first solvent comprises one or multiple solvent substances.

3. The photoresist composition as claimed in claim 1, wherein the second solvent comprises one or multiple solvent substances.

4. The photoresist composition as claimed in claim 1, wherein the photoresist composition is applicable in manufacturing a color filter.

5. A color filter manufacturing method, comprising the following steps:
   (1) providing a photoresist composition, which comprises a first solvent, a second solvent, a photo initiator, a monomer, a polymer, an additive, and a pigment, wherein the photoresist composition is coated on a backing plate in such a way that ingredients of the photoresist composition are uniformly mixed;
   (2) subjecting the photoresist composition to a pre-baking operation, wherein during the pre-baking operation, phase separation occurs between the first solvent and the second solvent of the photoresist composition and after the phase separation, the first solvent is located at an upper layer, while the second solvent is located at a lower layer, wherein at least one of the photo initiator, the monomer, the polymer, and the additive has solubility in the second solvent higher than that in the first solvent;
   (3) subjecting the photoresist composition that has been subjected to phase separation to exposure, wherein under irradiation, the photo initiator contained in the photoresist composition causes a polymerization reaction of the monomer to thereby get solidified, wherein at least one of the photo initiator, the monomer, the polymer, and the additive has a concentration in the lower layer that is greater than that in the upper layer so that the upper and lower layers have substantially identical degrees of solidification; and
   (4) subjecting the photoresist composition that has been subjected to exposure to development and high-temperature post-baking operations to obtain a color filter;
   wherein the photo initiator has solubility in the second solvent that is higher than that in the first solvent.

6. The color filter manufacturing method as claimed in claim 5, wherein in the photoresist composition, the first solvent comprises one or multiple solvent substances.

7. The color filter manufacturing method as claimed in claim 5, wherein in the photoresist composition, the second solvent comprises one or multiple solvent substances.

8. The color filter manufacturing method as claimed in claim 5, wherein in step (3), the exposure is conducted by irradiating the photoresist composition with ultraviolet light.

9. A photoresist composition, comprising a first solvent, a second solvent, a photo initiator, a monomer, a polymer, an additive, and a pigment;
   wherein after the photoresist composition is heated, phase separation occurs between the first solvent and the second solvent so that after the phase separation, the first solvent is located above the second solvent, at least one of the photo initiator, the monomer, the polymer, and the additive having solubility in the second solvent higher than that in the first solvent;
   wherein the first solvent comprises one or multiple solvent substances;
   wherein the second solvent comprises one or multiple solvent substances; and
   wherein the photo initiator has solubility in the second solvent that is higher than that in the first solvent.

10. The photoresist composition as claimed in claim 9, wherein the photoresist composition is applicable in manufacturing a color filter.

* * * * *